United States Patent
Gäbler

(10) Patent No.: US 11,404,461 B2
(45) Date of Patent: Aug. 2, 2022

(54) ANTI-REFLECTIVE LAYERS IN SEMICONDUCTOR DEVICES

(71) Applicant: Daniel Gäbler, Apolda (DE)

(72) Inventor: Daniel Gäbler, Apolda (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 0 days.

(21) Appl. No.: 16/451,642

(22) Filed: Jun. 25, 2019

(65) Prior Publication Data
US 2019/0393251 A1 Dec. 26, 2019

(30) Foreign Application Priority Data
Jun. 25, 2018 (GB) .................................. 1810383

(51) Int. Cl.
*H01L 27/146* (2006.01)
*G02B 1/11* (2015.01)

(52) U.S. Cl.
CPC ............ *H01L 27/1462* (2013.01); *G02B 1/11* (2013.01); *H01L 27/14643* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| 10,700,225 B2 * | 6/2020 | Wang ................... H04B 10/801 |
| 2006/0011955 A1 | 1/2006 | Baggenstoss |
| 2008/0048283 A1 | 2/2008 | Han |
| 2008/0198454 A1 | 8/2008 | Wang et al. |
| 2009/0261353 A1 | 10/2009 | Gaebler et al. |
| 2010/0117108 A1 | 5/2010 | Gaebler et al. |
| 2011/0176023 A1 * | 7/2011 | Jung ................... H01L 27/1464 348/222.1 |
| 2012/0161290 A1 * | 6/2012 | Javey ................... H01L 21/0262 257/616 |
| 2015/0054042 A1 * | 2/2015 | Marty ................... H01L 27/14689 257/292 |
| 2017/0062507 A1 * | 3/2017 | Crocherie ........... H01L 27/1462 |

FOREIGN PATENT DOCUMENTS

EP     1 432 044     6/2004

OTHER PUBLICATIONS

GB, Combined Search and Examination Report under Sections 17 and 18(3); Patent Application No. GB1810383.8; 6 pages (dated Nov. 30, 2018).
GB, Search Report under Section 17(6); Patent Application No. GB1810383.8; 3 pages (dated Sep. 9, 2019).

* cited by examiner

Primary Examiner — Khaja Ahmad
(74) Attorney, Agent, or Firm — Thompson Hine LLP

(57) ABSTRACT

A Complementary Metal Oxide Semiconductor, CMOS, device for radiation detection. The CMOS device includes a semiconductor diffusion layer having a photodetector region for receiving incident light, and a polysilicon layer having a patterned structure in a region at least partially overlapping the photodetector region. The structure includes a plurality of features being perforations extending through the polysilicon layer or columns of polysilicon, wherein the perforations are filled with, or the columns are surrounded by, a dielectric material.

16 Claims, 10 Drawing Sheets

ANTI-REFLECTIVE LAYERS IN SEMICONDUCTOR DEVICES

This application claims priority to UK Patent Application No. 1810383.8 filed on Jun. 25, 2018, the entire contents of which are hereby incorporated by reference.

TECHNICAL FIELD

The disclosure relates to anti-reflective layers in semiconductor devices.

BACKGROUND

CMOS-fabricated devices can be used for radiation detection by having an optically active photodetector region (e.g. a photodiode). The fraction of incident light which is coupled into the photodetector region and converted to a measurable signal is commonly quantified by the quantum efficiency, which is usually wavelength-dependent. CMOS-fabricated devices are typically formed in silicon. Because of the high refractive index of silicon, a significant amount of light is reflected before it enters the photodetector region of the photodiode with the result that this light is not available for sensing and the quantum efficiency of the device is degraded.

Reflection losses occur because of a big difference in the refractive index between the typical backend layers (i.e. oxide isolation layers) on top of the silicon and the silicon itself. In some CMOS processes there is already an extra layer close to the silicon interface with a higher refractive index than the usual oxide isolation layers. This layer is a silicon nitride ($Si_3N_4$) or silicon oxynitride (SION) layer and may be referred to as the Contact Stop Layer (CSL). It is necessary for the contact etch to stop before reaching the silicon (or more precisely the silicide) and then to change the etching process for a soft landing. As a side effect the higher refractive index of this layer, reduces the difference towards the underlying silicon ($Si_3N_4$ n=2 to Si n=3.8→1.8, vs. $SiO_2$ n=1.4 to Si n=3.8→2.4). With such a layer the reflection at the silicon interface is reduced from 22% to only 12%. With an appropriate thickness the reflection at a certain wavelength can be reduced to values below 5%.

In U.S. Patent Application Publication No. 2009/0261353 a method is described to use a special process step to structure the silicon surface in a way to create a stochastic effective medium with graded refractive index, that supresses reflection effectively and couples nearly all light into the silicon. However, this technique requires special processing, which is not available in a standard CMOS process.

SUMMARY

Aspects of the present invention provide Complementary Metal Oxide Semiconductor (CMOS) devices, and methods of manufacturing such, as set out in the accompanying claims. In one embodiment the invention is a Complementary Metal Oxide Semiconductor, CMOS, device for radiation detection. The CMOS device includes a semiconductor diffusion layer having a photodetector region for receiving incident light, and a polysilicon layer having a patterned structure in a region at least partially overlapping the photodetector region. The structure includes a plurality of features being perforations extending through the polysilicon layer or columns of polysilicon, wherein the perforations are filled with, or the columns are surrounded by, a dielectric material.

Certain embodiments are described below with reference to the accompanying drawings.

DETAILED DESCRIPTION

Figure 1:
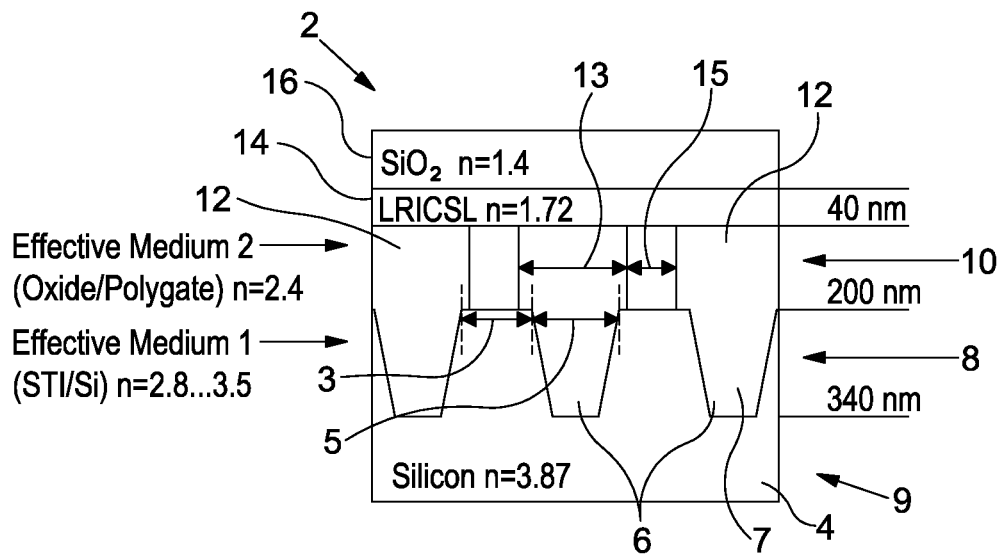
FIG. 1 is a schematic diagram of a cross section of a part of a semiconductor device according to an embodiment.

Embodiments described herein provide anti-reflection layers which can improve the fraction of incident light coupled into a photodetector region of a CMOS light sensor, and which are compatible with standard CMOS fabrication processes, e.g. using Shallow Trench Isolation (STI) and Poly gate sequence processes. The skilled person will understand a standard CMOS process to involve a large number (sometimes over 100) process steps. A CMOS process can include the following elements and process steps:

A N or P type doped silicon wafer;
Formation of one or more isolation wells of opposite type to the wafer;
Lateral isolation (e.g. Field Oxide, or trench isolation, typically STI);
A gate complex (gate oxide growth, poly gate formation including spacer);
Source/Drain formation (n or p type shallow high dose doping);
Contact formation (usual silicidation process, isolation layer and metallization, typically in multiple layers connected by VIAs (i.e. vertical interconnect access connections));

Passivation formation (a silicon nitride layer is commonly used to protect the chip);

Connection pad opening (mask defined removal of passivation and isolation layers on top of a landing metal area used for electrical connections, typically by bond wires).

Two options for improving the coupling and reducing reflection losses are:

1. Add a layer with a perfect refractive index (between $SiO_2$ and Si). However, the refractive index must be higher than $Si_3N_4$ can offer. Typically, such materials are not available in a standard CMOS process and especially not that close to the silicon interface.

2. Create a graded index using an effective medium. By forming a layer comprising different proportions of materials having different refractive indices, a layer of an effective medium is formed having a refractive index between that of the two materials. The proportions of the two different materials can be changed continuously (e.g. linearly or exponentially) as a function of depth to cause the refractive index to change smoothly through the layer.

Embodiments described herein can make use of both of these options.

A higher refractive index than $Si_3N_4$ can be created by an effective medium formed by a mixture of silicon oxide ($SiO_2$) and silicon and/or a mixture of silicon oxide and polysilicon. The volume ratio of different materials can be controlled to allow the synthesis of nearly any refractive index between that of silicon oxide and silicon. The mixture is created by the layout/structure of the semiconductor diffusion ("DIFF") layer and/or the polysilicon ("Poly") layer. For the DIFF and Poly layers a large plate is perforated with holes in the size close to the minimum Critical Dimension (CD) and spacing allowed by the CMOS technology used. The optically dense silicon and polysilicon is left as a "grid" and the trenches/perforations are filled with dielectric material (e.g. $SiO_2$). Also the opposite is possible, that the inverse polarity of a photolithography mask is used to form dots of silicon or polysilicon. In this case, a patterned structure comprising a plurality of raised portions of silicon is formed in the semiconductor diffusion layer, and the surrounding area is filled with the dielectric material. Similarly, in the polysilicon layer, columns of polysilicon can be formed by etching away the surrounding polysilicon. The area surrounding the columns of polysilicon can then be filled with the dielectric material. Although embodiments described below focus mainly on the case of forming trenches in the semiconductor diffusion layer and perforations in the polysilicon layer, the skilled person will understand how analogous embodiments having raised portions and columns (formed by using an inverse polarity of the mask) may be used instead. In each case, the patterned structure comprising a plurality of features (i.e. trenches, raised portions, perforations or columns) forms a layer of an effective medium having an effective refractive index for light in a particular wavelength range. The wavelength range is determined by the size and spacing of the features.

In the silicon (DIFF) layer, trenches are formed by Shallow Trench Isolation (STI) in the CMOS process. The trenches extend up to a few 100 μm (e.g. between 100 nm and 500 nm) into the depth of the silicon layer. Beneficially, the STI trenches may have a certain taper shape (i.e. they narrow with depth), which therefore gives the effective medium a graded refractive index which grows with depth. The polysilicon layer is perforated through the whole layer thickness, and the perforations are completely filled with dielectric material (e.g. $SiO_2$). A spacer containing $Si_3N_4$ may be included at the edges of the polysilicon, which then needs to be considered in the mixing ratio.

The pattern can be formed by hexagon shapes in a hexagonal arrangement. However, for simplicity, squares in a quadratic arrangement can also be used. Any other shape and arrangement is also possible, as long as at least one component of the mixture is small enough in its optical active extent, so that it is smaller than the wavelength of light to be detected. If this is not the case, there can still be a benefit in the coupling efficiency, but there will be some oscillations as the light will distinguish between the two or more materials in the layers. Depending on the CMOS technology used and the wavelength range of interest the width of the trenches may be in the range of 250 nm to 310 nm, and the minimum spacing between trenches may be in the range of 190 nm to 250 nm. Similarly for the Poly layer, the perforations may have a width in the range of 220 nm to 350 nm, and the minimum spacing between perforations may be in the range of 150 nm to 210 nm.

A downside of patterning the DIFF layer and/or Poly layer in the CMOS process is that the minimum achievable structure sizes (i.e. width and spacing) are typically still too large to build a perfect "black silicon" like in U.S. Patent Application Publication No. 2009/0261353.

However, beneficially, embodiments provide improvements without process modification (i.e. without requiring additional steps beyond those of a standard CMOS process).

FIG. 1 shows a cross section of a part of a semiconductor device 2 according to an embodiment. The device 2 has a silicon layer 4, which is the semiconductor diffusion (DIFF) layer 4. The silicon layer 4 has a plurality of trenches 6 formed therein. The trenches are formed by STI (Shallow Trench Isolation) in a standard CMOS process, which limits the minimum size (e.g. width 3) of the trenches 6 and the minimum spacing 5 between the trenches 6. The trenches 6 are filled with silicon oxide ($SiO_2$) 7 which has a refractive index of n=1.4. The trenches form a layer 8 of an effective medium along the top of the silicon layer 4 (i.e. at the silicon interface) that extends down to the depth (340 nm) of the trenches 6. The trenches 6 are formed in a photodetector region 9 of the device 2, i.e. in the optically active region where incident light is detected. The refractive index of the effective medium is in the range of 2.8 to 3.5, depending on the volume ratio of silicon oxide to silicon. The trenches 6 have a taper such that the volume ratio of silicon oxide to silicon decreases with depth. As the proportion of silicon increases with depth so does the refractive index of the effective medium. Hence, the taper of the trenches 6 causes the refractive index to increase continuously with depth through the layer 8 of the effective medium. For example, the refractive index of the effective medium in the layer 8 may be 2.8 along the top (at the silicon interface) where the trenches are widest, and 3.5 at the bottom where the trenches are narrowest. The graded refractive index reduces reflection losses and supresses interference at the silicon interface.

A polysilicon (Poly) layer 10 is deposited on top of the silicon layer 4. A plurality of perforations 12 are formed in the Poly layer 10. The perforations 12 are aligned with the underlying trenches 6 in the silicon layer 4. The perforations 12 extend through the whole thickness (200 nm) of the Poly layer 10, and are filled with silicon oxide 7. The polysilicon and the oxide filled perforations 12 of the Poly layer 10 form another effective medium. The perforations 12 have a width 13 and a spacing 15 between adjacent perforations 12. Because the perforations 12 are larger than the trenches 6, there is a greater proportion of silicon oxide in the Poly layer 10 compared to the silicon layer 4. Therefore, the effective medium of the Poly layer 10 has a lower refractive index compared to that of the effective medium formed by the silicon and oxide filled trenches 6. In this embodiment the refractive index of the effective medium of the Poly layer 10 is n=2.4.

On top of the Poly layer 10 a contact stop layer (CSL) 14 is deposited. In this embodiment, the CSL 14 has a thickness of 40 nm and a refractive index of n=1.72. Importantly, the refractive index of the CLS 14 is lower (closer to oxide, n=1.4) than the refractive index of the effective medium of the underlying Poly layer 10. The CSL 14 may be referred to as a Low Refractive Index Contact Stop Layer (LRICSL) 14. On top of the CSL 14 a first oxide isolation layer 16 is deposited. The isolation layer 16 is made of silicon oxide and has a refractive index of n=1.4.

Figure 2:
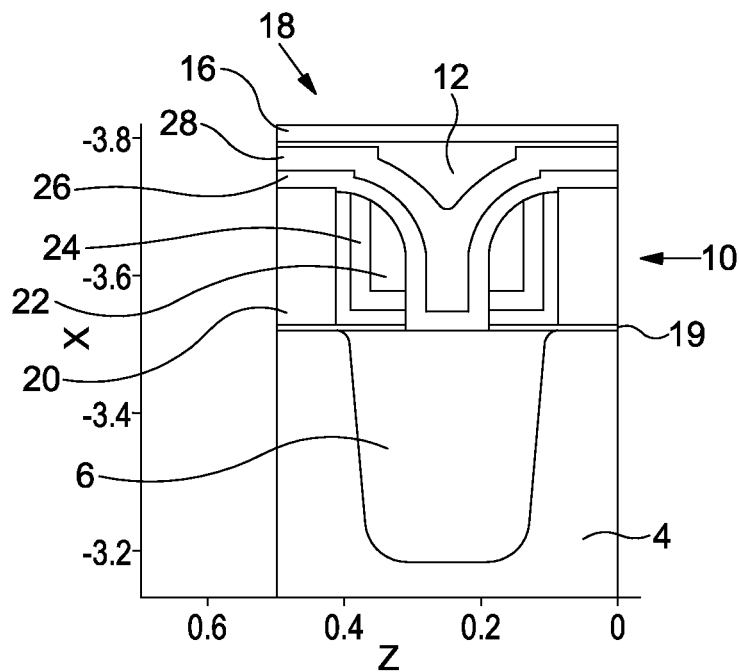
FIG. 2 is a schematic diagram of a cross section of a part of a semiconductor device according to another embodiment.

FIG. 2 shows a cross section of a part of a semiconductor device 18 according to an embodiment. FIG. 2 shows the minimum cell of a periodic pattern from a 3D TCAD simulation of the device 18. The device 18 has a semiconductor diffusion (DIFF) layer 4 with a trench 6 formed by STI in a standard CMOS process. The trench 6 is filled with a dielectric material (e.g. $SiO_2$) 7. On top of the semiconductor diffusion layer 4 is gate oxide 19 and a Poly layer 10 including polysilicon 20, dielectric material 22 (e.g. oxide), $Si_3N_4$ 24, oxide 26 and CSL 28 (e.g. $Si_3N_4$). Air 16 is included in the TCAD simulation for simplicity, but in an actual CMOS process, more layers are added on top.

The perforations 12 in the Poly layer 10 can lie on top of (i.e. be aligned with) the trenches 6 in the silicon as in FIGS. 1 and 2, but this is not necessary. Also, the perforations 12 in the Poly layer 10 can be larger than the trenches 6 in the DIFF layer 4, to get a lower refractive index in the effective medium comprising polysilicon than in the effective medium comprising STI. Thereby a steadily increasing refractive index from the oxide isolation layers 16 to the silicon can be created. The biggest benefit is in the blue and UV spectral range, where the STI can double the amount of light coupled into silicon compared to a Poly pattern only. In the IR spectral range, there is less benefit to having both a patterned Poly layer and a patterned DIFF layer.

Figure 3:
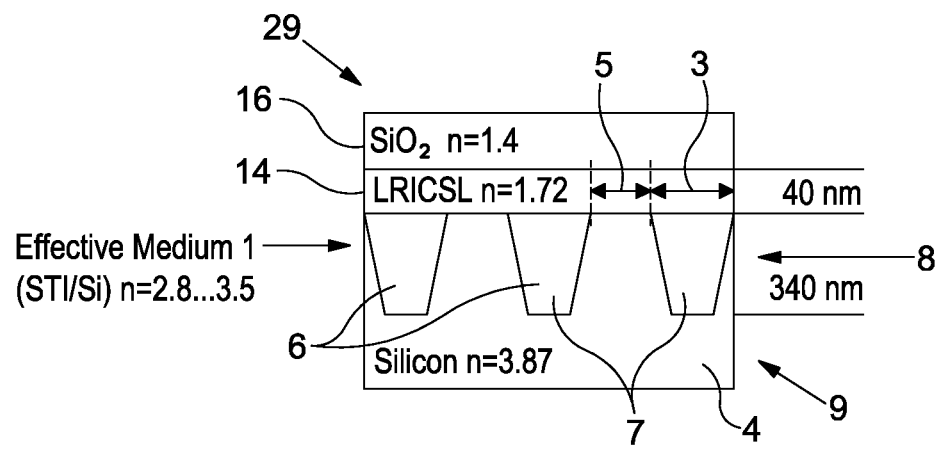
FIG. 3 is a schematic diagram of a cross section of a part of a semiconductor device according to another embodiment.

In another embodiment, illustrated in FIG. 3, a device 29 has only a patterned semiconductor diffusion layer 4 (i.e. the silicon layer). By not having a Poly layer 10, all (or nearly all) light may reach the silicon in the photodetector region 9. This embodiment may be particularly advantageous for use with blue and UV light, as no absorbing material is in the light path. Optionally, in this embodiment a contact stop layer (CSL) 14 may be used. However, if a nitride rich CSL 14 is present, UV light will be absorbed and reflected. Hence, for UV (i.e. wavelengths<350 nm) applications it may in some cases be desired not to use a CSL 14 or a CSL with low absorption (typically also with lower refractive index).

As a drawback, the trenches 6 formed using STI may interfere with the semiconductor device 2. In typical CMOS processes, most implantations (i.e. doping) are done after STI creation. However, the silicon oxide 7 in the trenches 6 can block or shift the implantation. Additionally, the STI creates a larger silicon interface, which may cause more surface recombination and other surface effects that can be detrimental.

Figure 4:
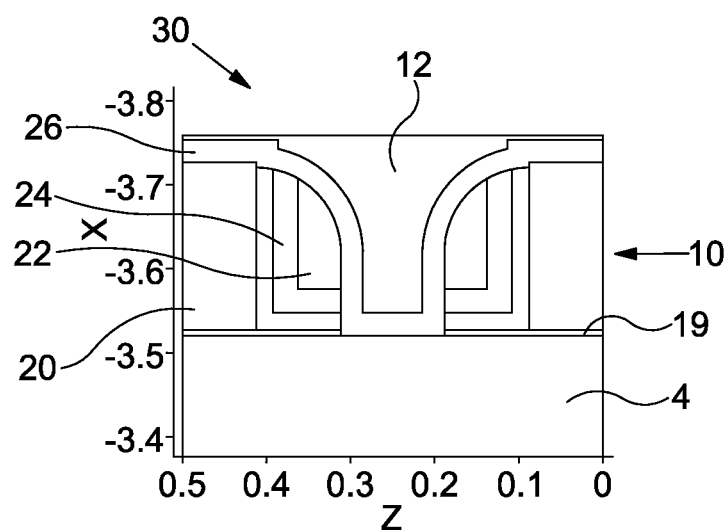
FIG. 4 is a schematic diagram of a cross section of a part of a semiconductor device according to a further embodiment.

FIG. 4 shows a cross section of a part of a semiconductor device 30 according to another embodiment. The Poly layer includes polysilicon 20 with a perforation 12 filled with dielectric material 22, and oxide 26. In the device 30, only the Poly layer 10 is patterned and not the semiconductor diffusion layer 4. The silicon surface is not modified, and the Poly layer 10 impacts implantations much less than STI. However, polysilicon 20 absorbs light. An unpatterned Poly layer blocks light having a wavelength below 400 nm completely, and reduces the intensity for wavelengths below 750 nm. The patterning of the Poly layer 10 allows light to be transmitted through the layer 10 even for blue and UV light. Depending on the pattern, the effective transmission into silicon is in the range of less than 10% for wavelengths below 400 nm. A CSL also impacts this range adversely and is the minor contributor to the weak coupling efficiency. The Poly pattern is better suited for Infrared (IR) applications, as polysilicon 20 does not absorb those wavelengths.

Figure 5:
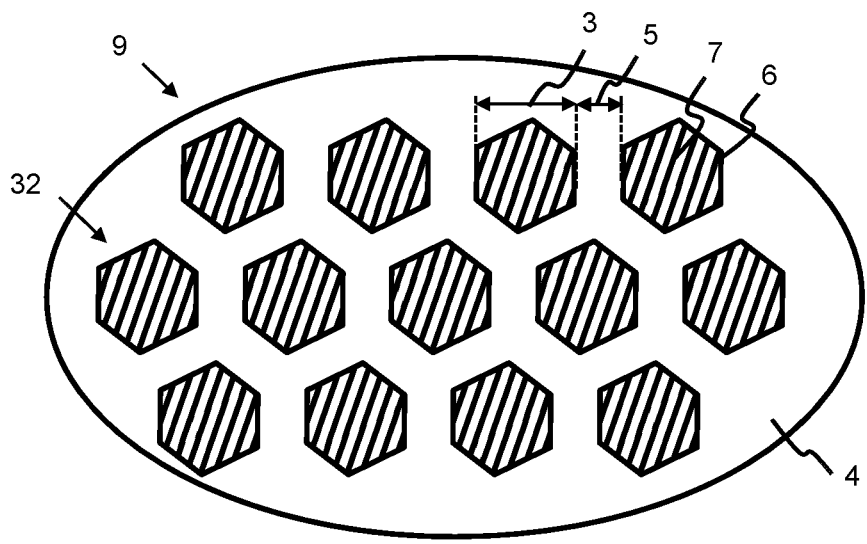
FIG. 5 is a schematic diagram of a photodetector region of a CMOS device according to an embodiment.

FIG. 5 shows a top view of the photodetector region 9 of the semiconductor diffusion layer 4 according to an embodiment. The semiconductor diffusion layer 4 has a patterned structure 32 formed therein. The patterned structure 32 comprises a plurality of trenches 6 filled with a dielectric material 7. The trenches 6 have a hexagonal shape with a width 3 and a spacing 5 determined, in part, by the target wavelength range and the operational constraints (e.g. minimum CD) of the CMOS technology used (e.g. 0.18 μm or 0.13 μm CMOS technology). The trenches 6 form a hexagonal pattern in the semiconductor diffusion layer 4. In the STI process, a photolithography mask may be used to pattern the semiconductor diffusion layer 4 before etching the layer to form the trenches 6.

Figure 6:
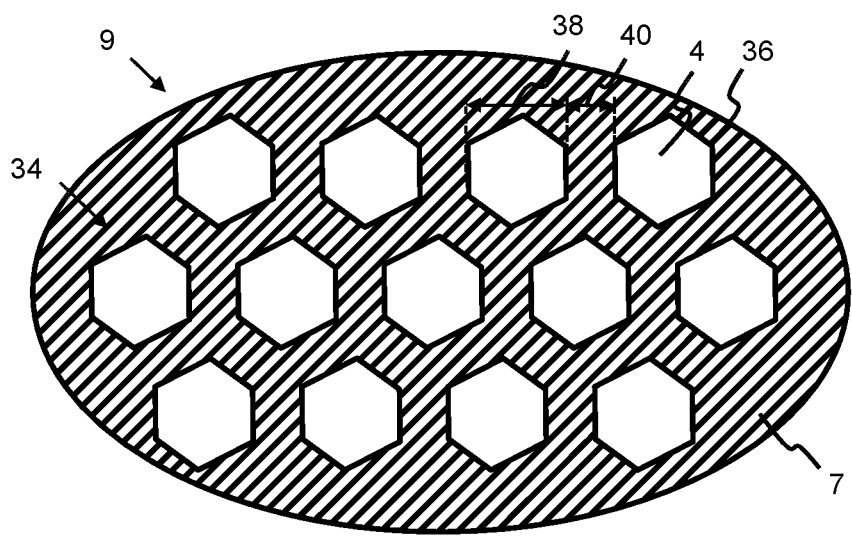
FIG. 6 is a schematic diagram of a photodetector region of a CMOS device according to an alternative embodiment.

FIG. 6 shows a top view of the photodetector region 9 according to another embodiment. In the photodetector region 9 there is a patterned structure 34 comprising raised portions 36 of the semiconductor diffusion layer 4. The raised portions 36 are surrounded by a dielectric material 7. The raised portions 36 have a hexagonal shape with a width 38 and spacing 40 determined, in part, by the target wavelength range and the operational constraints of the CMOS technology used. The raised portions 36 form a hexagonal pattern on the semiconductor diffusion layer 4. In the STI process, a photolithography mask (with an inverse polarity compared to that used in the embodiment illustrated in FIG. 5) may be used to pattern the semiconductor diffusion layer 4 before etching the layer to form the raised portions 36.

Figure 7:
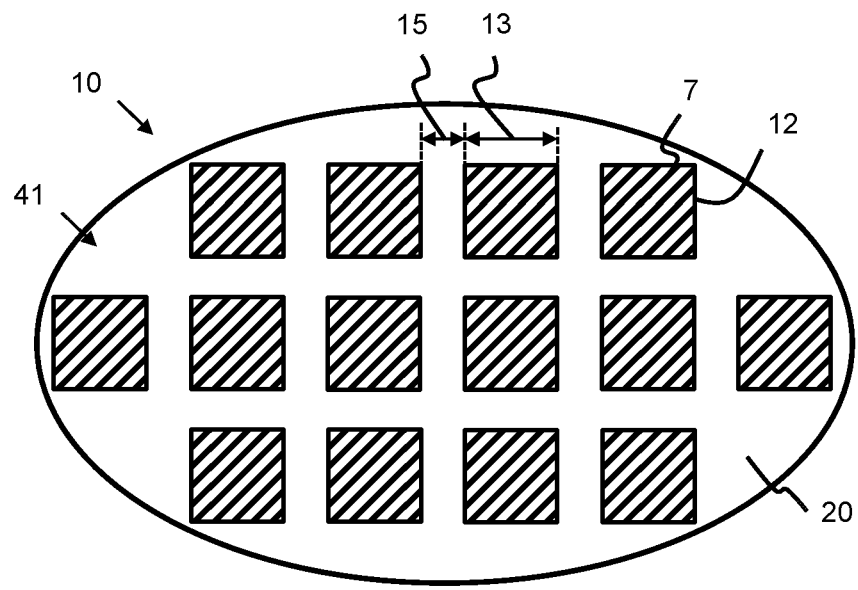
FIG. 7 is a schematic diagram of a Poly layer of a CMOS device according to an embodiment.

FIG. 7 shows a top view of a part of a Poly layer 10 according to an embodiment. The Poly layer 10 has a patterned structure 41 comprising polysilicon 20 and perforations 12 filled with dielectric material 7. The perforations 12 have a square shape with a width 13 and a spacing 15 determined, in part, by the target wavelength range and the operational constraints of the CMOS technology used. In the Poly layer sequence (of the CMOS process), a photolithography mask may be used to pattern the Poly layer 10 before etching the layer to form the perforations 12.

Figure 8:
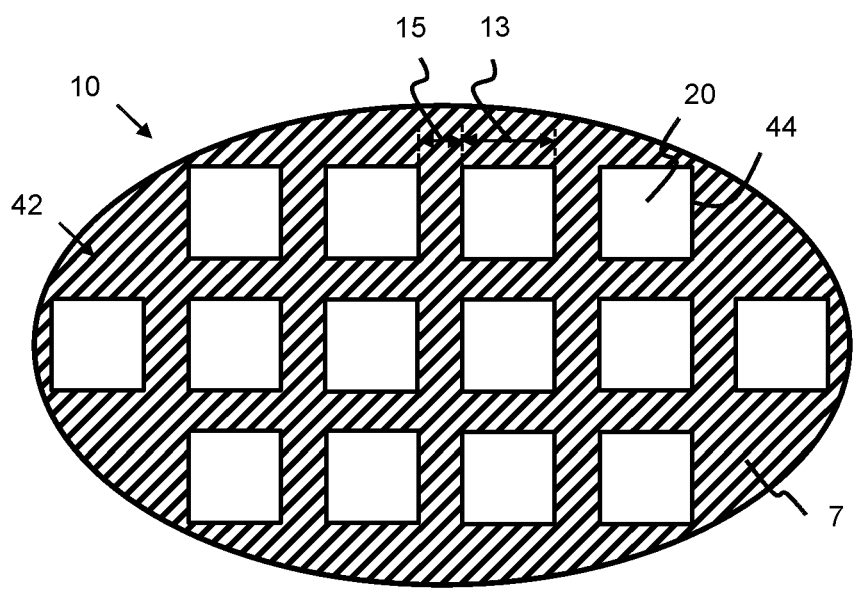
FIG. 8 is a schematic diagram of a Poly layer of a CMOS device according to an alternative embodiment.

FIG. 8 shows a top view of a part of a Poly layer 10 according to another embodiment. The Poly layer 10 has a patterned structure 42 comprising columns 44 of polysilicon 20 surrounded by a dielectric material 7. The columns 44 have a square shape with a width 13 and a spacing 15 determined, in part, by the target wavelength range and the operational constraints of the CMOS technology used. In the Poly layer sequence (of the CMOS process), a photolithography mask (with an inverse polarity compared to that used in the embodiment illustrated in FIG. 7) may be used to pattern the Poly layer 10 before etching the layer to form the columns 44.

Figure 9:
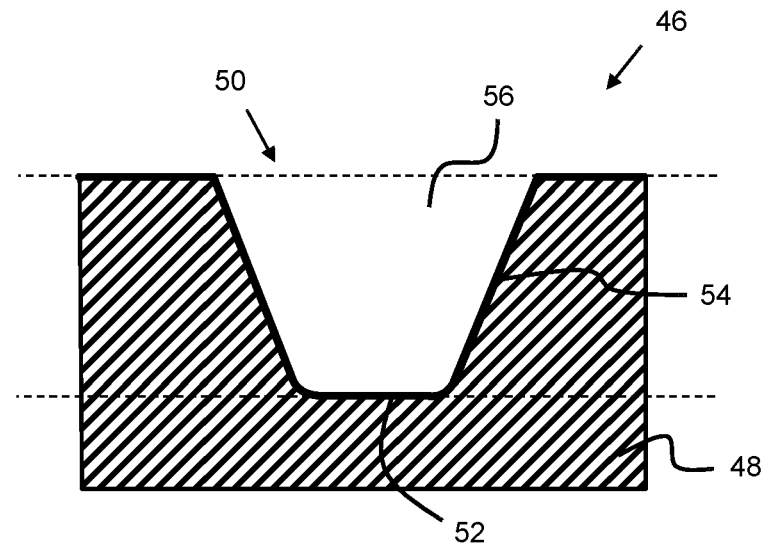
FIG. 9 is a schematic cross-section of a trench according to an embodiment.

FIG. 9 is a schematic cross section of a trench 46 in a semiconductor diffusion layer 48 according to an embodiment. The trench 46 has an opening 50, a bottom 52 with a substantially flat bottom portion, and tapered sides 54 between the opening 50 and the bottom 52. The shape of the trench 46, having a substantially flat bottom portion, is a typical feature resulting from the STI process by which the trenches are formed. In general the opening 50 will be wider than the bottom 52, resulting in tapered/sloped sides 54. The difference in width and the gradient of the slope of the sides 54 depends on factors such as the size and depth of the trench 46. For example, the width of the opening 50 of the trench 46 may be 250 nm, whereas the width of the bottom 52 may be in the range of 150 nm to 230 nm. The trench 46 is filled with a dielectric material 56 (e.g. silicon oxide). Because of the tapered sides 54, the volume ratio of dielectric material 56 decreases continuously with depth. Hence, the refractive index changes with depth throughout the layer being an effective medium defined by a patterned structure comprising the trench 46.

Figure 10:
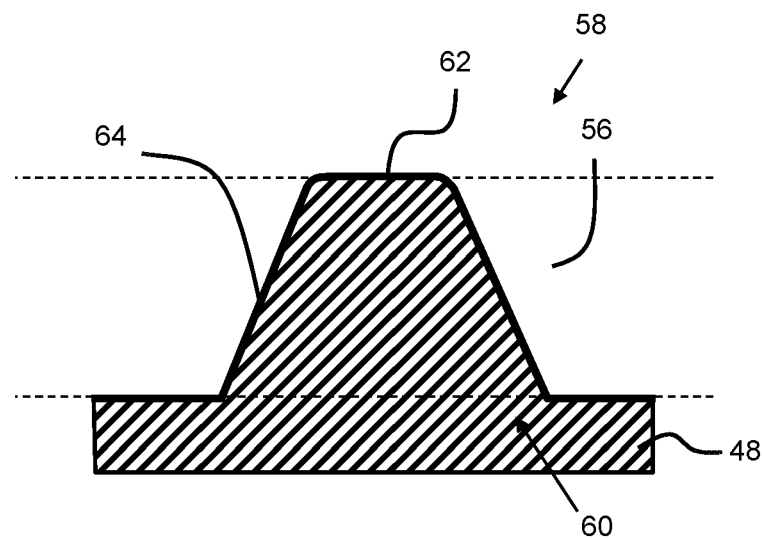
FIG. 10 is a schematic cross-section of a raised portion according to an embodiment.

FIG. 10 is a schematic cross section of a raised portion 58 in a semiconductor diffusion layer 48 according to an embodiment. The raised portion 58 has a foot 60, a top 62 with a substantially flat top portion, and tapered sides 64 between the foot 60 and the top 62. In general the foot 60 will be wider than the top 62, resulting in tapered/sloped sides 64. The difference in width and the gradient of the slope of the sides 64 depends on factors such as the size and height of the raised portion 58. The raised portion 58 is surrounded by a dielectric material 56 (e.g. silicon oxide). Because of the tapered sides 64, the volume ratio of dielectric material 56 decreases continuously with depth. Hence, the refractive index changes with depth throughout the layer being an effective medium defined by a patterned structure comprising the raised portion 58.

Figure 11:
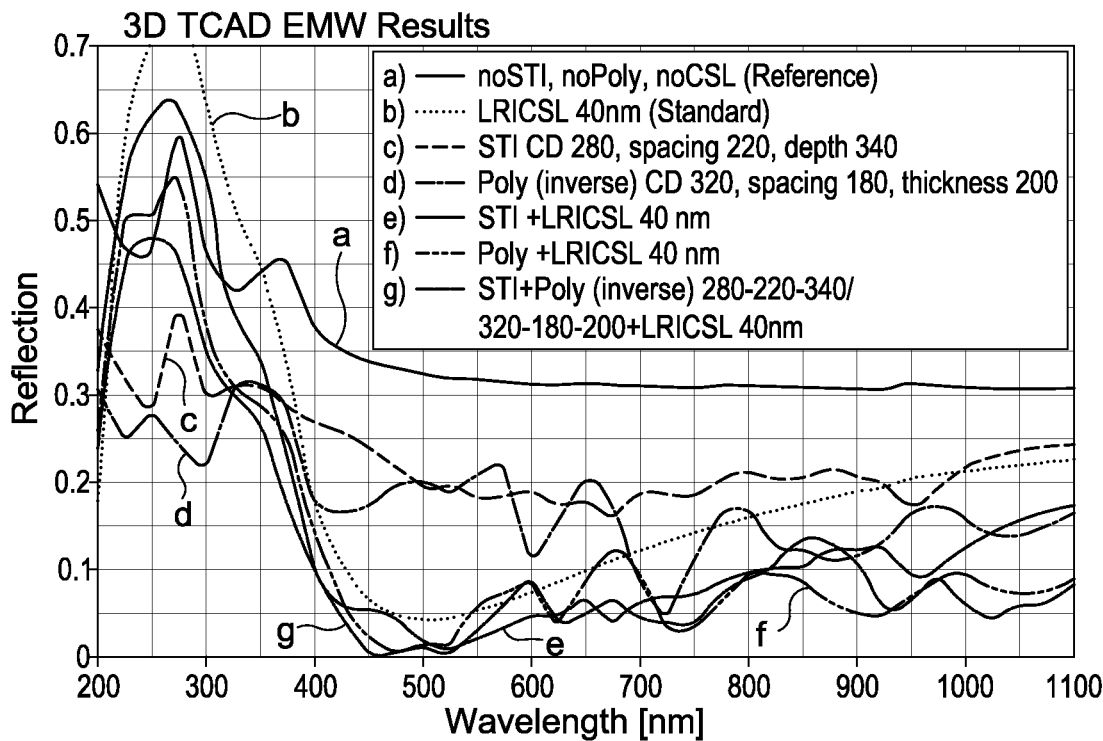
FIG. 11 is a graph showing the simulated reflection plotted against wavelength.

FIG. 11 shows the simulated reflection coefficient plotted against wavelength for various embodiments. 3D simulation with Synopsys EMW (Electromagnetic Wave Solver) was used. The reflection coefficient for the case of no matching layers and for a 40 nm CSL are also plotted for comparison. The CSL already acts quite well as an Anti-Reflective Coating (ARC) layer, but is strongly wavelength dependent. The patterned silicon (STI and/or Poly) reduces the reflection very well across the whole wavelength range, but does not improve much upon the CSL at the CSL caused reflection minimum (around 450 nm).

Figure 12:
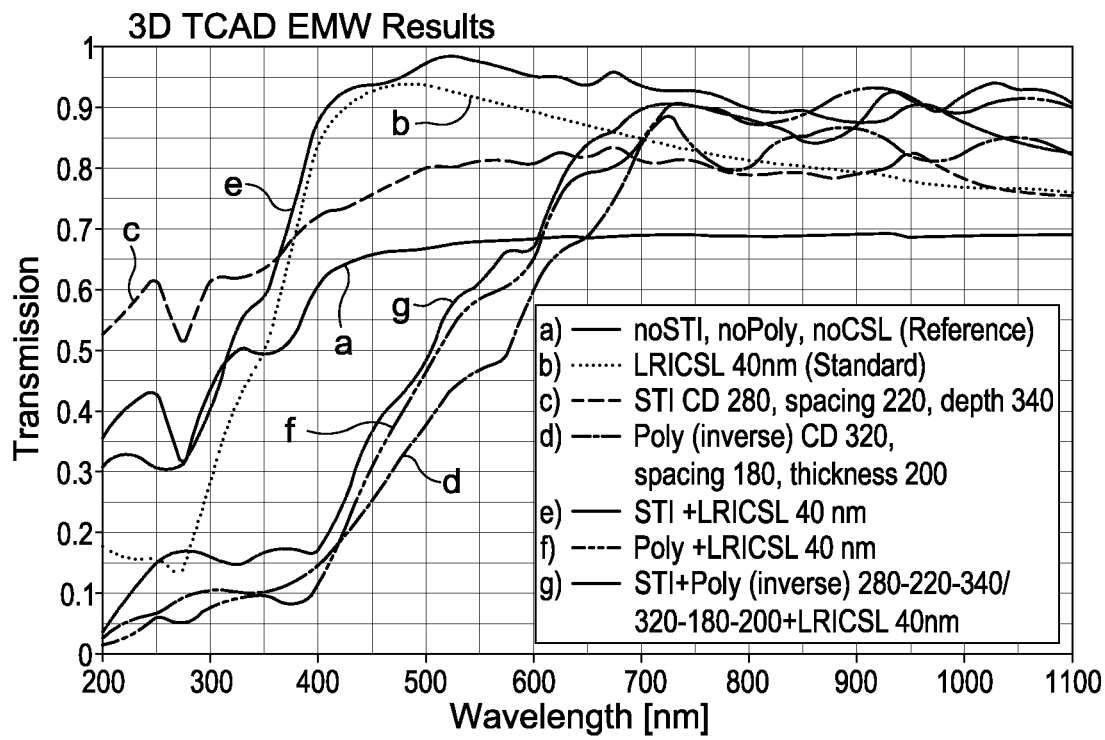
FIG. 12 is a graph showing the simulated transmission plotted against wavelength.

FIG. 12 shows the simulated transmission coefficient plotted against wavelength for various embodiments. The transmission coefficient for the case of no matching layers and for a 40 nm CSL are also plotted for comparison. In particular, for UV light with a wavelength below 300 nm, the embodiment using a patterned DIFF layer only (and no Poly layer or CSL) has up to four times greater transmission compared to just having a CSL. In general, using a Poly layer reduces the transmission performance at low wavelengths due to absorption.

Figure 13:
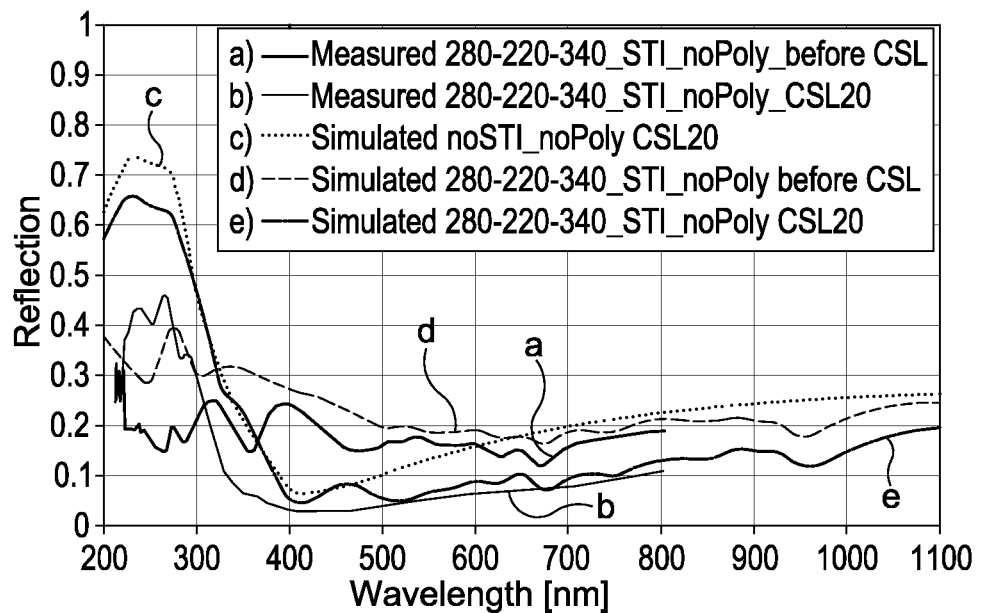
FIG. 13 is a graph showing simulated and measured results of the reflection.

FIG. 13 shows simulated and measured reflection spectra of different arrangements. In reality it seems that the CSL is thinner than expected, as the minimum is shifted towards lower wavelengths (from approximately 500 nm to 400 nm). Also the measured curves are lower and show less oscillations, which indicates that the shape of the STI is acting better than expected from the simulation results. One explanation is that small fluctuations between the multiple STI elements level out oscillations, compared to the perfect repeated structures of the simulated 3D model.

Figure 14:
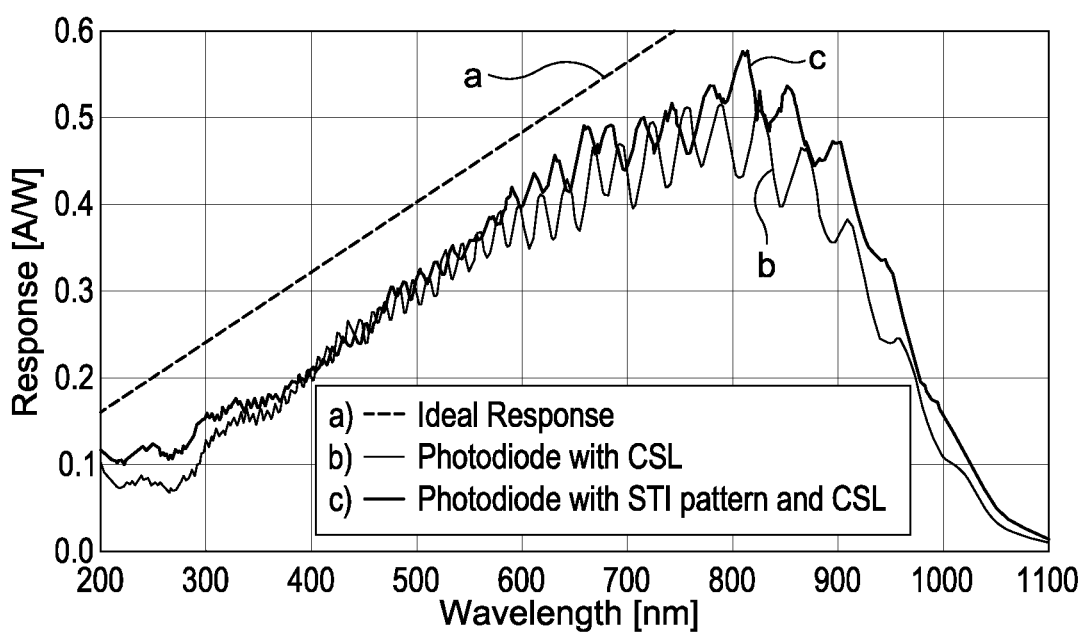
FIG. 14 is a graph showing the response of photodiodes plotted against wavelength.

FIG. 14 shows an example of a photodiode spectral response measured with and without an STI pattern according to an embodiment. Apart from at the optimum wavelength of the CSL (around 450 nm) the STI pattern shows an improved response. In addition to the higher sensitivity, the remaining spectral oscillations are lowered in amplitude significantly.

A big benefit of the patterned effective index layers (i.e. the patterned DIFF and Poly layers) is their broadband working ranges. Whereas the CSL acts effectively only for a small wavelength range defined by its thickness and refractive index, the STI and or Poly patterned structures can act effectively across the whole wavelength range of interest. With typical design rules/limitations of "0.18 µm CMOS technology", the usable range is at least from 200 nm to 1100 nm, which is where most silicon based optical detectors work. Below 200 nm a vacuum is required to not block the light and to still achieve an effective medium, and the structures need to be of smaller size. An effective medium works if the optical extent of one material is less than the wavelength, thus ensuring that the light does not distinguish between different materials in the effective medium. In our case this is achieved with the silicon oxide portion, as this has the small refractive index of 1.4 and thus a STI structure of width 280 nm translates to an optical extent of 392 nm. Because the STI trenches get smaller in diameter with increasing depth, the resulting features are sufficiently small for the required working range of 200 nm to 1100 nm wavelength.

Figure 15:
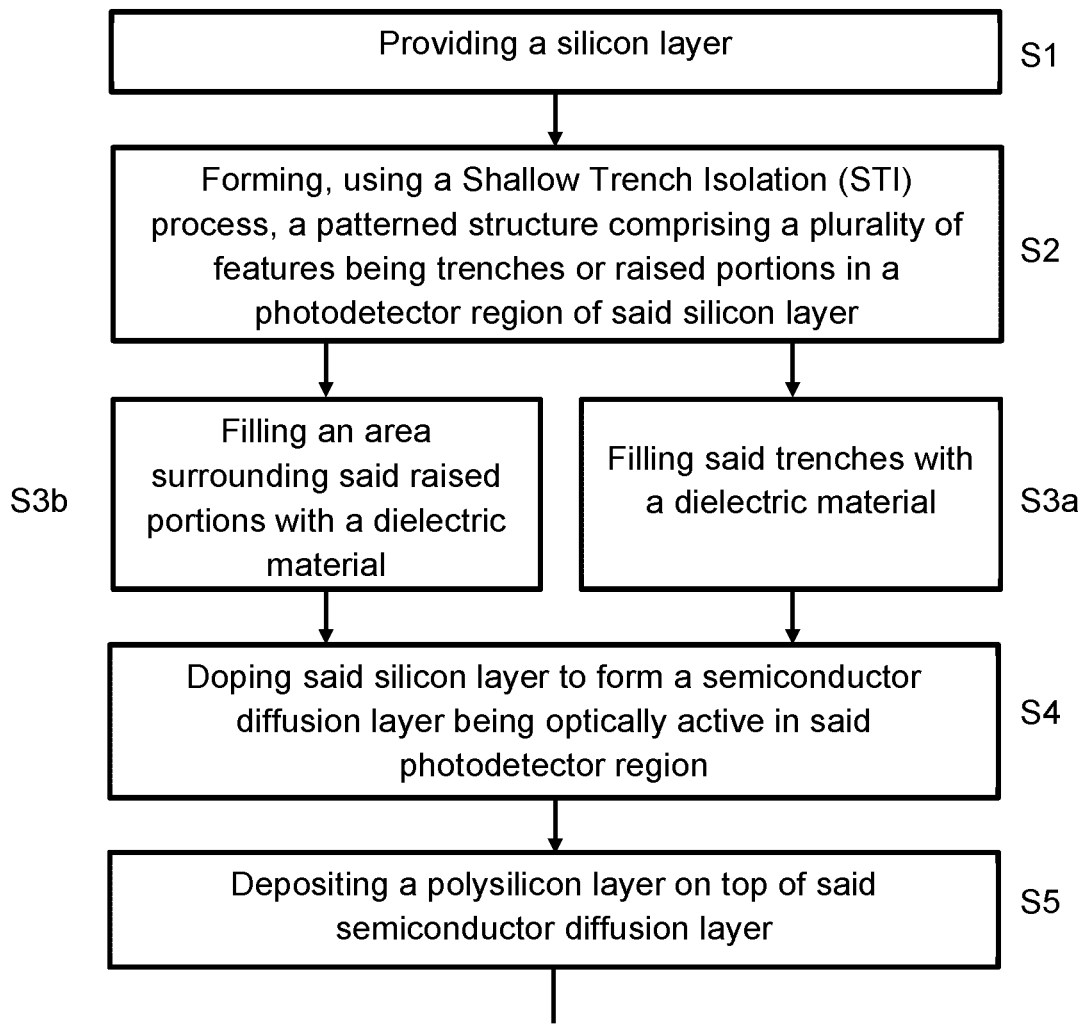
FIG. 15 is a flow diagram illustrating a method according to an embodiment.
Figure 15:
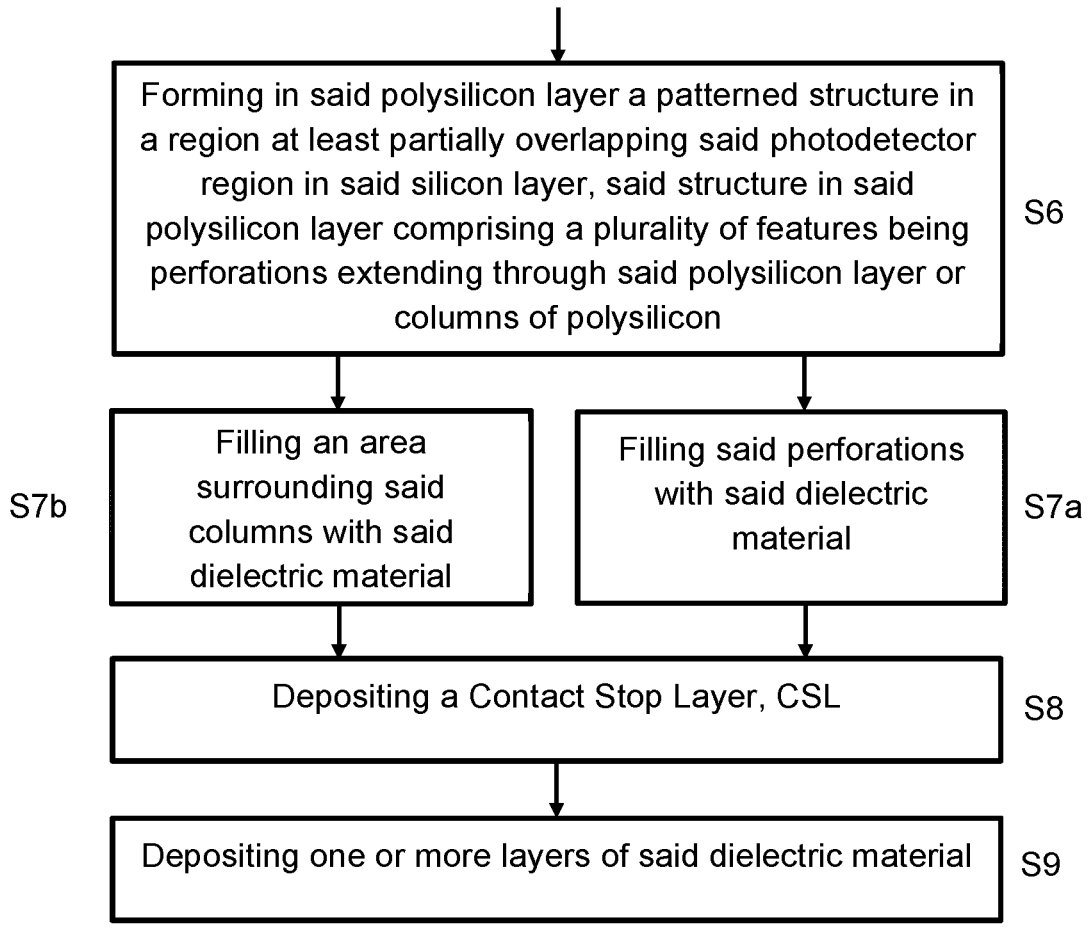

FIG. 15 is a flow diagram illustrating the steps of a method of manufacturing a semiconductor device for radiation detection in a CMOS process according to an embodiment. To aid understanding, reference numerals given in the method below refer back to components of the semiconductor device shown in FIG. 1, but the method is not limited to the device of FIG. 1. The method comprises providing a silicon layer 4 (e.g. by depositing a silicon layer or by providing a silicon wafer) (step S1), forming, using a Shallow Trench Isolation, STI, process a patterned structure comprising a plurality of features being trenches 6 or raised portions in a photodetector region of said silicon layer (step S2), and filling said trenches 6 with a dielectric material 7 (step S3a) or filling an area surrounding said raised portions with a dielectric material (step S3b). The method further comprises doping said silicon layer 4 to form a semiconductor diffusion layer 4 being optically active in said photodetector region 9 (step S4). The method may further comprise depositing a polysilicon layer 10 on top of said semiconductor diffusion layer 4 (step S5), forming in said polysilicon layer 10 a patterned structure in a region at least partially overlapping said photodetector region 9 in said silicon layer 4, said structure in said polysilicon layer 10 comprising a plurality of features being perforations 12 extending through said polysilicon layer 10 or columns of polysilicon (step S6), and filling said perforations with said dielectric material (step S7a) or filling an area surrounding said columns with said dielectric material (step S7b). The method can further comprise depositing a Contact Stop Layer, CSL, 14 (step S8), either on top of the polysilicon layer 10, or on top of the semiconductor diffusion layer 4 if no polysilicon layer 10 is present, and depositing one or more layers 16 of said dielectric material (step S9).

Figure 16:
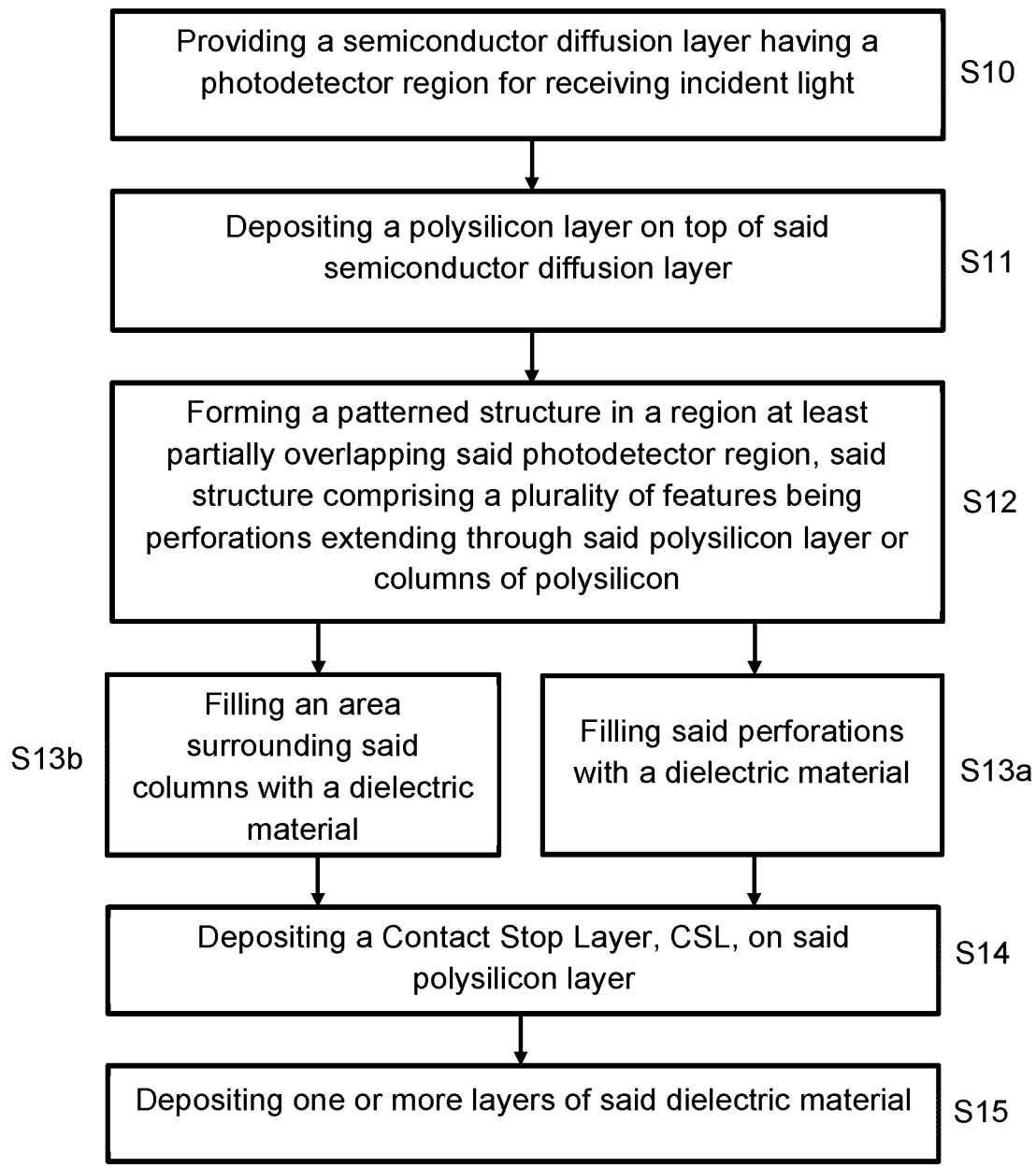
FIG. 16 is a flow diagram illustrating a method according to another embodiment.

FIG. 16 is a flow diagram illustrating the steps of a method of manufacturing a semiconductor device for radiation detection in a CMOS process according to another embodiment. To aid understanding, reference numerals given in the method below refer back to components of the semiconductor device shown in FIG. 3, but the method is not limited to the device of FIG. 3. The method comprises providing a semiconductor diffusion layer 4 having a photodetector region 9 for receiving incident light (step S10), depositing a polysilicon layer 10 on top of said semiconductor diffusion layer 4 (step S11), forming a patterned structure in a region at least partially overlapping said photodetector region 9, said structure comprising a plurality of features being perforations 12 extending through said polysilicon layer 10 or columns of polysilicon (step S12), and filling said perforations 12 with a dielectric material 7 (step S13a) or filling an area surrounding said columns with a dielectric material (step 13b). The method may further comprise depositing a Contact Stop Layer, CSL, 14 on said polysilicon layer 10 (step S13), and depositing one or more layers 16 of said dielectric material (step S14).

As an example a concrete implementation in an 0.18 µm CMOS technology is described. The technology allows for minimum STI spacing of 220 nm and minimum STI width of 280 nm. For Poly the minimum allowed spacing of holes in that layer is 180 nm and the minimum hole diameter is 250 nm.

A photodiode in the DIFF layer is used and modified in a CMOS process as follows:

1. In the optical active region (i.e. the photodetector region) trenches are formed in the DIFF layer (in one case by hexagons with the diameter/width substantially equal to the minimum allowed size of 280 nm, or larger if short wavelengths are not important). The arrangement of the trenches can be either quadratic or hexagonal with the latter giving the better mixing and symmetry. The trench spacing should be as small as possible (here 220 nm is the lower limit) as this determines the amount of silicon in the mixture and the smallest oxide extent, which need to be small enough for all target wavelengths, to keep the effective medium condition.
2. Polysilicon is added to the optical active area of the photodiode and perforated similar to the DIFF region. As the hole spacing is allowed to be 180 nm for the Poly layer this smaller value is used and the holes can become 320 nm wide. Hence a mixture with a lower refractive index is achieved. The Poly and STI pattern lie perfectly on top of each other.
3. After the Poly sequence the contact stop layer (CSL) is added. In this example it is a layer of 40 nm thickness and a refractive index of 1.72.

An advantage of this method is that it can be used in a standard CMOS process.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

What is claimed is:

1. A Complementary Metal Oxide Semiconductor, CMOS, device for radiation detection, said CMOS device comprising:
   a semiconductor diffusion layer having a photodetector region for receiving incident light; and
   a polysilicon layer having a patterned structure in a region at least partially overlapping said photodetector region, said structure comprising a plurality of features being perforations extending through said polysilicon layer or columns of polysilicon, wherein said perforations are filled with, or said columns are surrounded by, a dielectric material, wherein said polysilicon layer has a thickness in the range of 150 nm to 250 nm.

2. The CMOS device according to claim 1, wherein each feature has a width in the range of 220 nm to 350 nm and a spacing from an adjacent feature in the range of 150 nm to 210 nm.

3. The CMOS device according to claim 1, wherein said patterned structure forms a layer which is an effective medium having a refractive index in the range of 2.3 to 3.0 for light having a wavelength between 200 nm and 1100 nm.

4. The CMOS device according to claim 1, wherein said semiconductor diffusion layer comprises silicon and said dielectric material is one of silicon oxide, $SiO_2$, silicon nitride, $Si_3N_4$, and silicon oxynitride, SION.

5. The CMOS device according to claim 1, wherein each of said features has a same shape, and wherein said shape is one of circular, hexagonal and square.

6. The CMOS device according to claim 1, further comprising a contact stop layer, CSL.

7. The CMOS device according to claim 6, wherein said CSL comprises silicon nitride, $Si_3N_4$, or silicon oxynitride, SION.

8. The CMOS device according to claim 1, further comprising:
   a second patterned structure providing an effective medium formed in said semiconductor diffusion layer in said photodetector region so that light entering the photodetector region passes through the effective medium when in use, said second patterned structure comprising features being trenches or raised portions, wherein said trenches are filled with, or said raised portions are surrounded by, a dielectric material, wherein said trenches have an opening, a bottom with a substantially flat bottom portion, and sides between said opening and said bottom, and wherein said raised portions have a foot, atop with a substantially flat top portion, and sides between said foot and said top.

9. The CMOS device according to claim 8, wherein each of said features in the diffusion layer has a width in the range of 250 nm to 310 nm and a spacing from an adjacent feature in the range of 190 nm to 250 nm.

10. The CMOS device according to claim 8, wherein said second patterned structure in said diffusion layer forms a layer which is an effective medium having a refractive index in the range of 2.8 to 3.5 for light having a wavelength between 200 nm and 1100 nm.

11. The CMOS device according to claim 10, wherein said sides are tapered such that said refractive index increases continuously with depth through said effective medium.

12. The CMOS device according to claim 8, wherein said semiconductor diffusion layer comprises silicon and said dielectric material is one of silicon oxide, $SiO_2$, silicon nitride, $Si_3N_4$, and silicon oxynitride, SION.

13. The CMOS device according to claim 8, wherein each of said features in said diffusion layer has a shape which is the same as each of the other of said features, and wherein said shape is one of circular, hexagonal and square.

14. The CMOS device according to claim 8, wherein said plurality of features forms a pattern in said semiconductor diffusion layer and said pattern is one of quadratic and hexagonal.

15. The CMOS device according to claim 8, wherein each of said features of said polysilicon layer at least partially overlaps a feature in said semiconductor diffusion layer.

16. A CMOS device according to claim 6, wherein said patterned structure of said polysilicon layer forms a layer which is an effective medium having a first refractive index, and wherein said CSL has a second refractive index which is lower than said first refractive index.

\* \* \* \* \*